(12) United States Patent
Koyama et al.

(10) Patent No.: US 7,333,077 B2
(45) Date of Patent: Feb. 19, 2008

(54) DISPLAY DEVICE AND ELECTRONIC DEVICE

(75) Inventors: Jun Koyama, Kanagawa (JP); Yu Yamazaki, Tokyo (JP); Yoshifumi Tanada, Kanagawa (JP); Satoshi Seo, Kanagawa (JP); Takeshi Nishi, Kanagawa (JP); Yasuo Nakamura, Tokyo (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 500 days.

(21) Appl. No.: 10/719,031

(22) Filed: Nov. 24, 2003

(65) Prior Publication Data

US 2004/0239658 A1   Dec. 2, 2004

(30) Foreign Application Priority Data

Nov. 27, 2002   (JP)   ............................. 2002-343552

(51) Int. Cl.
*G09G 3/30*   (2006.01)
(52) U.S. Cl. ...................... 345/76; 315/169.3
(58) Field of Classification Search .............. 345/76–8, 345/87–101, 80, 82; 315/169.1–169.4
See application file for complete search history.

(56) References Cited

U.S. PATENT DOCUMENTS

| | | | | |
|---|---|---|---|---|
| 5,896,575 | A * | 4/1999 | Higginbotham et al. | .... 455/566 |
| 6,466,292 | B1 | 10/2002 | Kim | |
| 6,674,496 | B2 * | 1/2004 | Wei | .............. 349/63 |
| 6,742,762 | B2 * | 6/2004 | Koyama | ...................... 251/59 |
| 6,861,710 | B2 | 3/2005 | Murakami et al. | |

(Continued)

FOREIGN PATENT DOCUMENTS

CN   2509675 Y   9/2002

(Continued)

OTHER PUBLICATIONS

Exhibition of Active Matrix Type Organic EL Display at "13th Flat Panel Display Manufacturing Technology Expo & Conference" by ELDis Group (*in Japanese with full translation*); Jul. 2, 2003.

(Continued)

*Primary Examiner*—Amr A. Awad
*Assistant Examiner*—Stephen G Sherman
(74) *Attorney, Agent, or Firm*—Fish & Richardson P.C.

(57) ABSTRACT

A display device capable of displaying on both screens and switching between vertical and horizontal display, and a driving method thereof. Each pixel comprises a first region including a first light emitting element, and a second region including a second light emitting element. The first region has a bottom emission structure whereas the second region has a top emission structure. The display device comprises a source signal line driver circuit for driving the pixel, a first gate signal line driver circuit having a scan direction perpendicular to that of the source signal line driver circuit, and a second gate signal line driver circuit having a scan direction perpendicular to that of the first gate signal line driver circuit. In a normal display, the first gate signal line driver circuit performs perpendicular scanning, and when switching between vertical and horizontal display, the second gate signal line driver circuit performs perpendicular scanning.

32 Claims, 10 Drawing Sheets

U.S. PATENT DOCUMENTS

| | | | |
|---|---|---|---|
| 6,897,914 | B2 | 5/2005 | Yoshida |
| 2003/0045043 | A1 | 3/2003 | Koyama |
| 2003/0063243 | A1* | 4/2003 | Roosendaal et al. ........ 349/113 |

FOREIGN PATENT DOCUMENTS

| | | | | |
|---|---|---|---|---|
| GB | 2305532 | A | * | 4/1997 |
| JP | 63-064082 | | | 3/1988 |
| JP | 07-175444 | | | 7/1995 |
| JP | 08-152619 | | | 6/1996 |
| JP | 09-127885 | | | 5/1997 |
| JP | 10-255976 | | | 9/1998 |
| JP | 11224783 | A | * | 8/1999 |
| JP | 2000-100558 | | | 4/2000 |
| JP | 2001-086205 | | | 3/2001 |
| JP | 2001-305525 | | | 10/2001 |
| JP | 2001-332392 | | | 11/2001 |
| JP | 2001-356714 | | | 12/2001 |
| JP | 2003-076315 | | | 3/2003 |
| JP | 3408154 | | | 3/2003 |
| JP | 2003-195824 | | | 7/2003 |
| JP | 2003-345271 | | | 12/2003 |
| KR | 2002094424 | A | * | 12/2002 |

OTHER PUBLICATIONS

Documents distributed in the "13th Flat Panel Display Manufacturing Technology Expo & Conference" by ELDis Group (5 pages).

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

International Search Report (Application No. PCT/JP03/14665) dated Feb. 24, 2004 (3 pages).

International Preliminary Examination Report (Application No. PCT/JP03/14665) dated Mar. 23, 2004 (6 pages).

Office Action Application No. 20038018900.8 PCTCN6764 dated Feb. 2, 2007, 8 pages.

* cited by examiner

DISPLAY DEVICE AND ELECTRONIC DEVICE

TECHNICAL FIELD

The present invention relates to a display device comprising a light emitting element. More particularly, the invention relates to portable information equipment such as mobile phones and PDAs.

BACKGROUND ART

In recent years, a display device using a self-light emitting element typified by an electroluminescence (EL) element and the like has been researched and developed to replace a liquid crystal display (LCD) using a liquid crystal element for a pixel. The display device using a self-light emitting element has the advantages of high image quality, wide viewing angle, and being thin and light because of requiring no backlight. Therefore, it is expected to be widely used as a display panel of a mobile phone or as a display device.

On the other hand, the portable information equipment is required to have high added value as the intended purpose thereof is diversified. Thus, the equipment provided with a sub-display screen on the back side of the main display screen has been provided recently.

Furthermore, it is possible to browse the Web pages on the portable information equipment and the application is improved. Therefore, the equipment whose screen can be switched between the horizontal direction and the vertical direction has been proposed.

In the portable information equipment provided with the sub-display screen besides the main display screen, not only the volume occupied by a module which includes a backlight or the like but also the volume occupied by a substrate which mounts a control IC or the like for driving the module is to be paid attention to. Particularly, in the recent portable information equipment, reduction in weight, thickness, and size is considerably advanced and trades off between a high added value. For example, when the portable information equipment which can display on both screens is fabricated by using a liquid crystal display, a display portion thereof is quite difficult to be thin since a backlight or the like has to be disposed between the two screens.

In addition, the number of pixels of a display device is generally different in the vertical and the horizontal directions. Accordingly, when switching between vertical and horizontal display, it is necessary for example that image signals of one frame are temporarily stored in a frame memory provided additionally, and then the format of the image signals are converted in accordance with the number of pixels in the vertical and the horizontal directions.

In accordance with the foregoing, the invention provides a display device which is thin and capable of displaying on both screens, and which can be made into a small module.

DISCLOSURE OF THE INVENTION

The invention takes the following measures to solve the above problem.

The invention provides a dual emission display device which uses a self-light emitting element typified by an EL element and the like for a pixel portion and which can emit light on both the upper and the bottom screens. A pixel is divided into a first region having a first light emitting element and a second region having a second light emitting element, for example. In the first light emitting element, a first electrode of an EL element is a transparent electrode and a second electrode thereof is a reflective electrode. In the second light emitting element, a first electrode of an EL element is a reflective electrode and a second electrode is a transparent electrode. That is, the first light emitting element and the second light emitting element emit light in the opposite direction to each other.

Since users usually do not look at both screens at the same time, a display screen may be selected as usage. For example, a switching element may be provided in any of the current paths supplied to an EL element so that current supply to the second light emitting element is interrupted when the first light emitting element emits light and current supply to the first light emitting element is interrupted when the second light emitting element emits light.

The invention provides a display device having a pixel portion in which pixels are arranged in matrix on a substrate. Each of the pixels comprises a first light emitting element and a second light emitting element. The first light emitting element emits light in only one direction perpendicular to a surface of the substrate on which the pixel portion is formed, whereas the second light emitting element emits light in only one direction which is opposite to the one direction and perpendicular to the surface of the substrate on which the pixel portion is formed.

The invention also provides a display device having a pixel portion in which pixels are arranged in matrix on a substrate. Each of the pixels comprises a first light emitting element and a second light emitting element. The first light emitting element emits light in only one direction perpendicular to a surface of the substrate on which the pixel portion is formed, whereas the second light emitting element emits light in only one direction which is opposite to the one direction and perpendicular to the surface of the substrate on which the pixel portion is formed. The display device further comprises a means for selecting either of the two directions in which the first light emitting element and the second light emitting element emit light, and a means for selecting both of the directions.

The invention also provides a display device having a pixel portion in which pixels are arranged in matrix on a substrate. Each of the pixels comprises a first light emitting element and a second light emitting element. The first light emitting element emits light in only one direction perpendicular to a surface of the substrate on which the pixel portion is formed, whereas the second light emitting element emits light in only one direction which is opposite to the one direction and perpendicular to the surface of the substrate on which the pixel portion is formed. The display device further comprises a source signal line driver circuit, a first gate signal line driver circuit and a second gate signal line driver circuit on the surface of the substrate on which the pixel portion is formed. A scan direction of the first gate signal line driver circuit is orthogonal to that of the second gate signal line driver circuit.

The invention also provides a display device having a pixel portion in which pixels are arranged in matrix on a substrate. Each of the pixels comprises a first light emitting element and a second light emitting element. The first light emitting element emits light in only one direction perpendicular to a surface of the substrate on which the pixel portion is formed, whereas the second light emitting element emits light in only one direction which is opposite to the one direction and perpendicular to the surface of the substrate on which the pixel portion is formed. The display device further comprises a means for selecting either of the two directions in which the first light emitting element and the second light emitting element emit light, and a means for selecting both of the directions. In addition, the display device comprises a source signal line driver circuit, a first gate signal line driver circuit and a second gate signal line driver circuit on the surface of the substrate on which the pixel portion is formed. A scan direction of the first gate signal line driver circuit is orthogonal to that of the second gate signal line driver circuit.

A sub-display screen of conventional portable information equipment is limited to a small size because of the space and the cost. However, according to the invention, a large screen can be mounted in the portable information equipment as a sub-display screen. Further, a function of switching between vertical and horizontal display can be easily mounted, leading to higher added value of the portable information equipment.

In addition, by utilizing a self-light emitting element which does not require a backlight, a quite thin and light display device can be fabricated.

BEST MODE FOR CARRYING OUT THE INVENTION

The invention will be described in more detail hereinafter with reference to accompanying drawings.

Embodiment Mode 1

Figure 2:
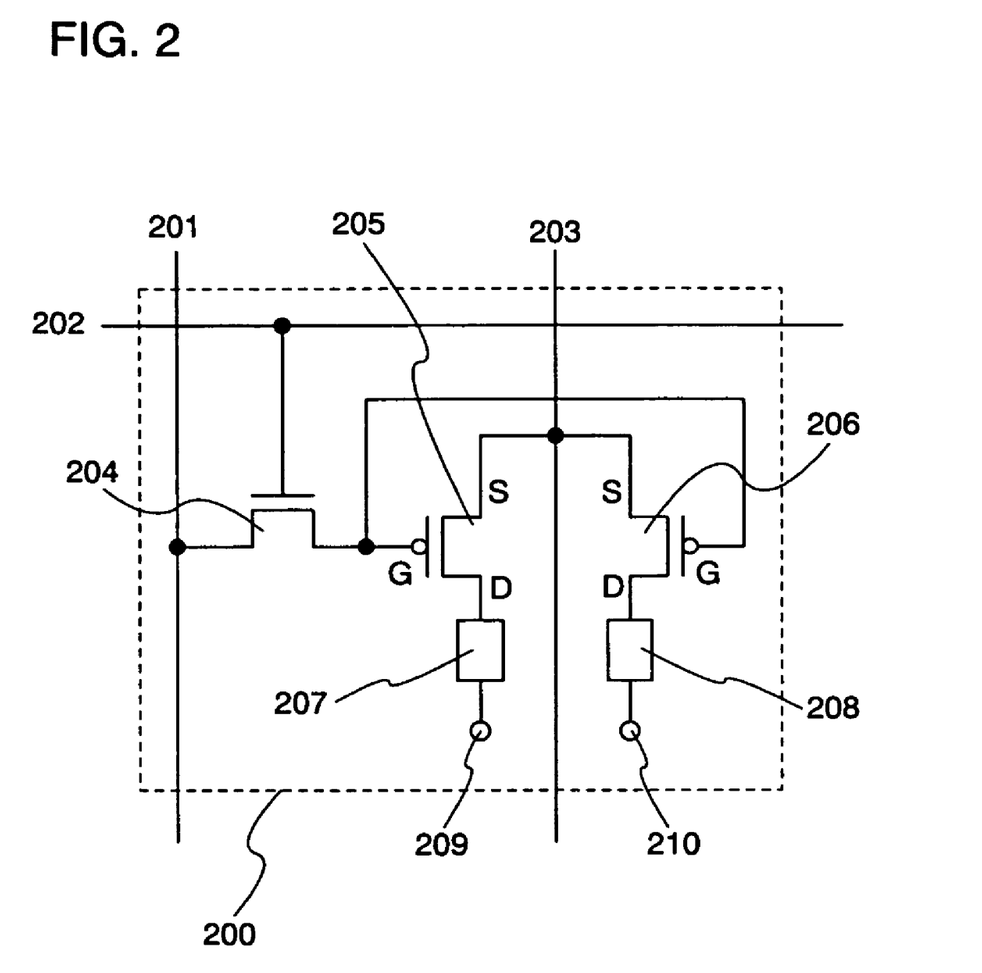
FIG. 2 is a diagram showing a circuit configuration example of the display device according to the invention.

FIG. 2 shows an embodiment mode of the invention. Note that a thin film transistor (TFT) is used as a switching element and a driving element herein, though the invention is not exclusively limited to this. A MOS transistor, an organic transistor, a molecule transistor or the like may be employed as well. Since it is difficult to differentiate a source region and a drain region of a TFT in accordance with the structure or the operating condition, one of the two regions is referred to as a first electrode and the other thereof is referred to as a second electrode.

In FIG. 2, a region surrounded by a dotted line frame 200 shows one pixel, which comprises a source signal line 201, a gate signal line 202, a current supply line 203, a switching TFT 204, a first driving TFT 205, a second driving TFT 206, a first light emitting element 207, and a second light emitting element 208. Each pixel includes a first region in which light from the first light emitting element 207 can be obtained, and a second region in which light from the second light emitting element 208 can be obtained.

A gate electrode of the switching TFT 204 is electrically connected to the gate signal line 202, a first electrode thereof is electrically connected to the source signal line 201, and a second electrode thereof is electrically connected to gate electrodes of the first and the second driving TFTs 205 and 206. A first electrode of the first driving TFT 205 is electrically connected to the current supply line 203, and a second electrode thereof is electrically connected to a first electrode of the first light emitting element 207. A first electrode the second driving TFT 206 is electrically connected to the current supply line 203, and a second electrode thereof is electrically connected to a first electrode of the second light emitting element 208. A second electrode of the first light emitting element 207 and a second electrode of the second light emitting element 208 are electrically connected to counter electrodes 209 and 210 respectively, each of which has a potential difference from the current supply line 203.

An image signal outputted to the source signal line 201 is inputted to the gate electrodes of the first and the second driving TFTs 205 and 206 when the switching TFT 204 is turned ON. The first and the second light emitting elements 207 and 208 are supplied with a current depending on the image signal, and emit light. As described above, light is emitted from the opposing surfaces of a substrate in the first region and the second region.

Figure 3:
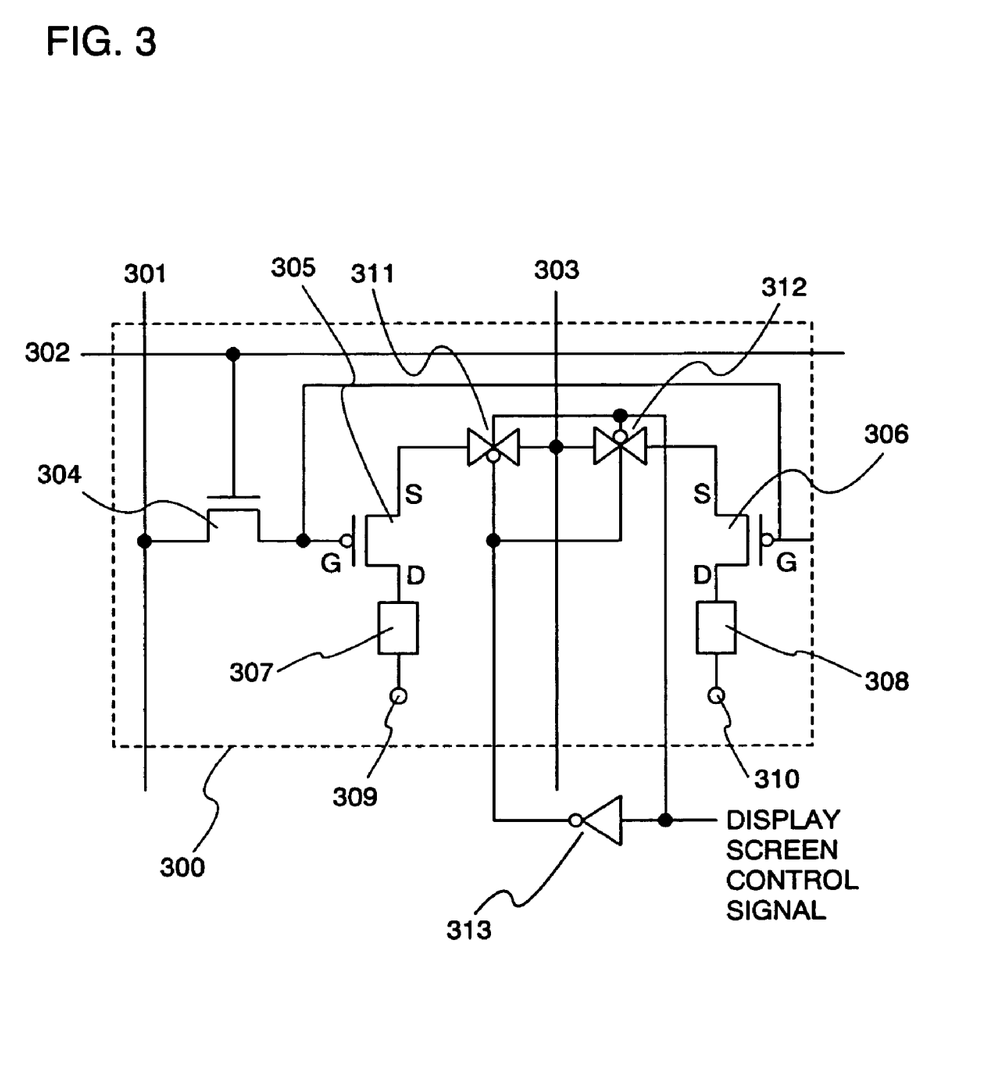
FIG. 3 is a diagram showing a circuit configuration example of the display device according to the invention.

According to this configuration, the first and the second driving TFTs 205 and 206 control light emission or non-light emission of the first and the second light emitting elements 207 and 208, respectively. However, as shown in FIG. 3, analog switches 311 and 312 which operate exclusively of each other may be provided between the current supply line 303 and the first electrodes of the first and the second driving TFTs 305 and 306, respectively so that a display screen control signal controls ON/OFF of the analog switches 311 and 312. When the analog switch 311 is turned ON, a current is supplied to the first light emitting element 307 and an image is displayed in the first region. On the other hand, the analog switch 312 which operates exclusively of the analog switch 311 is OFF during this period, and a current supply path to the second light emitting element 308 is interrupted. Thus, light is not emitted in the second region. Conversely, when the analog switch 312 is turned ON, a current is supplied to the second light emitting element 308 and an image is displayed in the second region. During this period, the analog switch 311 is OFF and a current supply path to the first light emitting element 307 is interrupted, therefore, light is not emitted in the first region. At this time, the display screen control signal may be outputted by some operation of users to switch a display screen, or a switching operation may be automatically performed according to the state of use (whether the equipment is folded or opened, for example).

Figure 4:
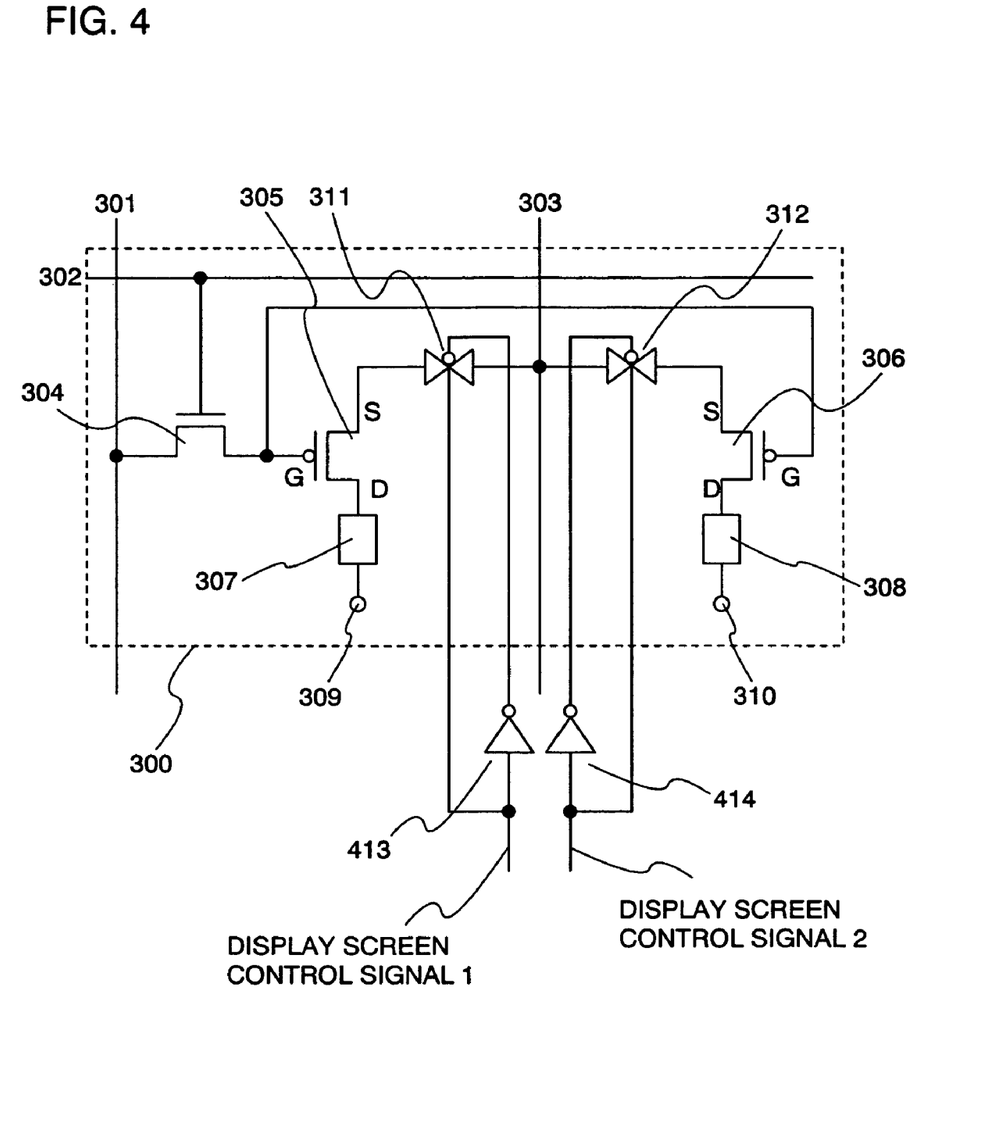
FIG. 4 is a diagram showing a circuit configuration example of the display device according to the invention.

FIG. 4 shows the case in which the analog switches 311 and 312 do not operate exclusively with each other, but they operate independently by using display screen control signals 1 and 2. According to the configuration shown in FIG. 4, whether display is performed or not can be switched arbitrarily in both the first and the second regions. It is to be noted that in FIG. 3, reference numeral 301 denotes a source signal line, 302 denotes a gate signal line, 304 denotes a switching TFT, and 313 denotes an inverter. In FIG. 4, reference numerals 413 and 414 denote inverters, and the same portions are denoted by the same reference numerals as in FIG. 3.

As a method for displaying different images in the first and the second regions by using the configurations shown in FIGS. 3 and 4, there is a method, for example, in which display in the first region is performed during odd frames and display in the second region is performed during even frames. At this time, the display screen control signals are inverted per frame period so that the analog switches 311 and 312 are switched ON/OFF per frame.

Embodiment Mode 2

Described mainly in this embodiment mode is a circuit configuration.

Figure 5:
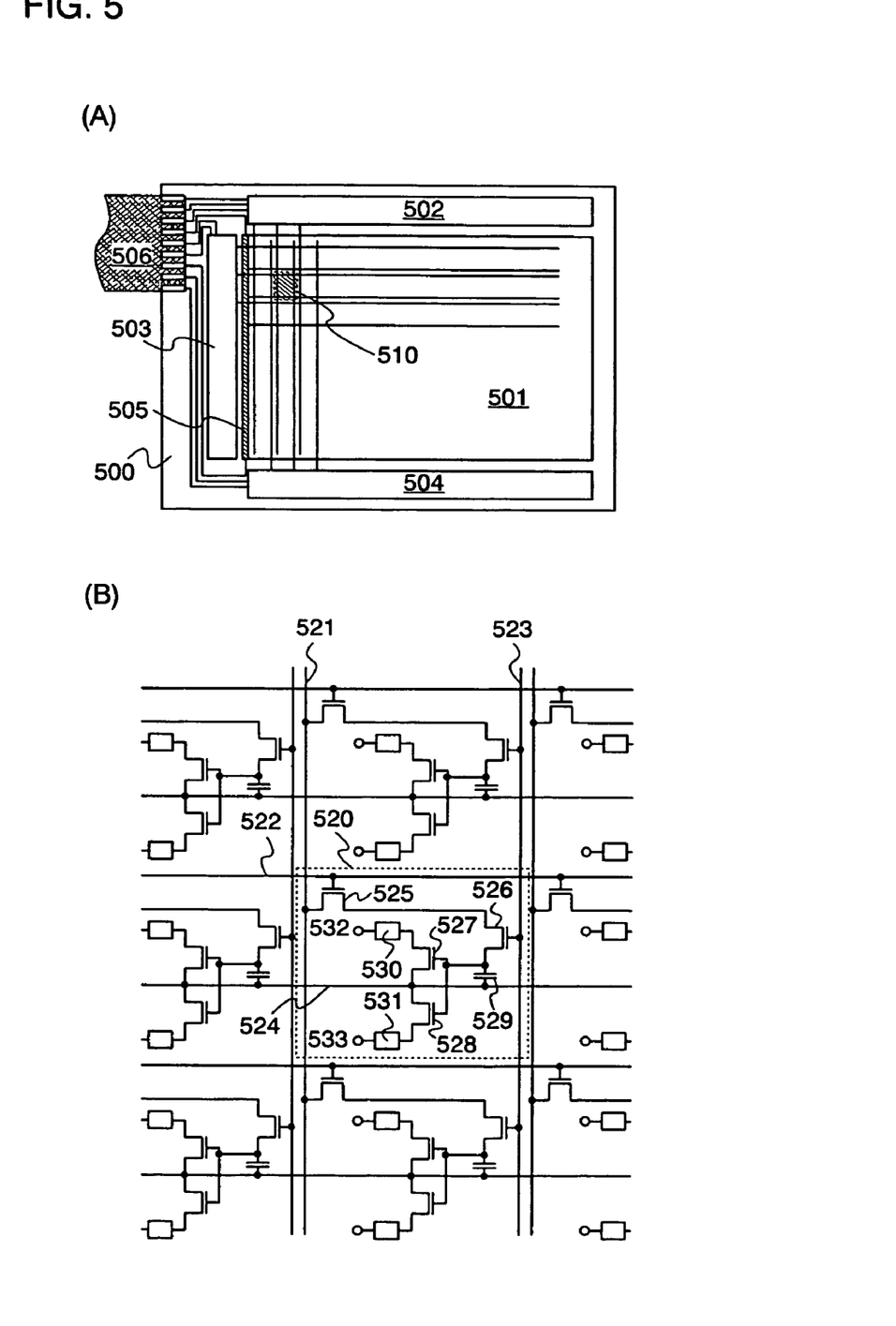
FIGS. 5(A) and 5(B) are diagrams showing a circuit configuration example of the display device according to the invention.
Figure 6:
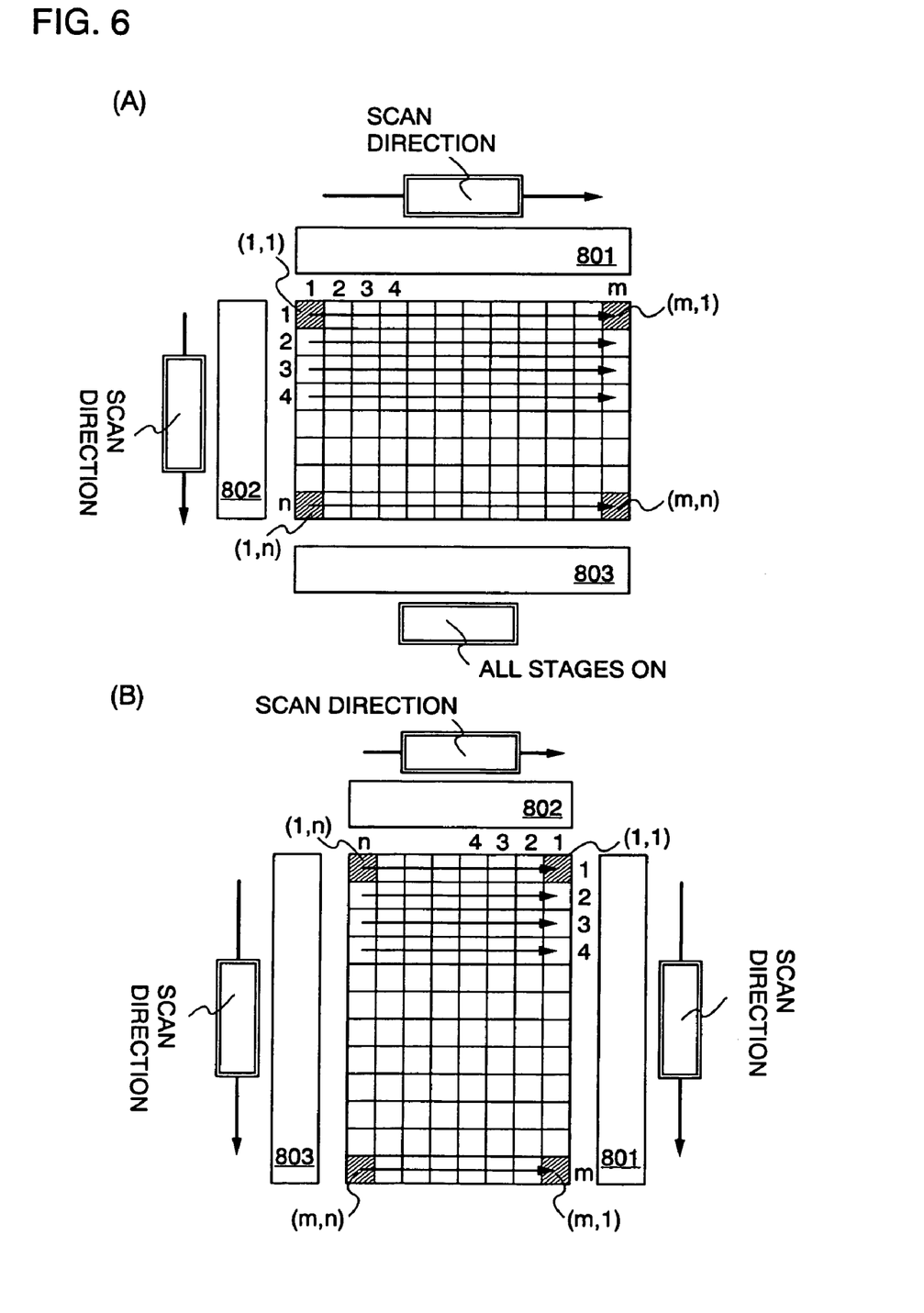
FIGS. 6(A) and 6(B) are diagrams showing an operating timing of the display device according to the invention.

FIG. 5A shows an example of a configuration of the display device according to the invention. A pixel portion 501 is formed on a substrate 500, and a source signal line driver circuit 502, a first gate signal line driver circuit 503, and a second gate signal line driver circuit 504 are formed in the peripheral portion of the pixel portion. A control signal input to each of the driver circuits and a current supply to a current supply line 505 are performed through a flexible printed circuit (FPC) 506. A portion denoted by 510 in FIG. 5A corresponds to one pixel, which is shown in more detail in FIG. 5B.

In FIG. 5B, a portion surrounded by a dotted line frame 520 is a pixel which comprises a source signal line 521, a first gate signal line 522, a second gate signal line 523, a current supply line 524, a first switching TFT 525, a second switching TFT 526, a first driving TFT 527, a second driving TFT 528, a storage capacitor 529, a first light emitting element 530, and a second light emitting element 531. Each pixel includes a first region in which light emission from the first light emitting element 530 can be obtained, and a second region in which light emission from the second light emitting element 531 can be obtained.

A gate electrode of the first switching TFT 525 is electrically connected to the first gate signal line 522, a first electrode thereof is electrically connected to the source signal line 521, and the second electrode thereof is electrically connected to a first electrode of the second switching TFT 526. A gate electrode of the second switching TFT 526 is electrically connected to the second gate signal line 523, and a second electrode thereof is electrically connected to each of gate electrodes of the first and the second driving TFTs 527 and 528. A first electrode of the first driving TFT 527 is electrically connected to the current supply line 524, and a second electrode thereof is electrically connected to a first electrode of the first light emitting element 530. A first electrode of the second driving TFT 528 is electrically connected to the current supply line 524, and a second electrode thereof is electrically connected to a first electrode of the second light emitting element 531. A second electrode of the first light emitting element 530 and a second electrode of the second light emitting element 531 are electrically connected to counter electrodes 532 and 533 respectively, which have a potential difference from the current supply line 524. The storage capacitor 529 is provided in order to store a gate-source voltage of the first and the second driving TFTs 527 and 528. In FIG. 5B, the storage capacitor 529 is disposed between the gate electrodes of the first and the second driving TFTs 527 and 528 and the current supply line 524, though the connection point is not limited to this.

Operation of the circuit is explained. Note that although the number of pixels is m×n pixels in this specification, any method can be adopted for converting the format of image signals. Thus, the case in which m=n is satisfied is taken as an example for simplicity. Explanation is made with reference to FIGS. 5A, 5B and 6.

In the case of performing a first display, namely a normal display in which the pixel portion includes m×n pixels, the second switching TFT 526 is turned ON in the full screen by the second gate signal line driver circuit 504. According to this, the pixel is controlled only by the first switching TFT 525 and the first and the second driving TFTs 527 and 528. Then, an image is displayed by driving the source signal line driver circuit 502 and the first gate signal line driver circuit 503 by a normal method. As shown in FIG. 6A, the order of writing an image signal to the pixel is (1, 1) (2, 1) . . . (m, 1), (1, 2) (2, 2) . . . (m, 2), . . . , (1, n) (2, n) . . . (m, n).

A case of performing a second display, namely switching between vertical and horizontal display on a screen, is described next. FIG. 6B is obtained by rotating a pixel of FIG. 6A clockwise by 90°. According to the display device of the invention, the input order of an image signal need not be changed. Accordingly, the order of writing to pixels shown in FIG. 6B is (1, n) (1, n-1) . . . (1, 1), (2, n) (2, n-1) . . . (2, 1), . . . , (m, n) (m, n-1) . . . (m,1).

Therefore, the source signal line driver circuit 502 operates slower than usual during performing the second display, and outputs a sampling pulse per one horizontal period. Therefore, image signals of one horizontal period are outputted in sequence for each source signal line. On the other hand, the first gate signal line driver circuit 503 operates faster than usual, and outputs a gate signal line selective pulse per one dot sampling period. According to this, the first switching TFT 525 in each pixel is ON during one dot sampling period only, and an image signal outputted to the source signal line 521 is written at that time. Further, the second gate signal line driver circuit 504 operates in synchronism with the source signal line driver circuit 502. That is, when a sampling pulse is outputted from the source signal line driver circuit 502 and an image signal is sequentially outputted to the source signal line 521 of a certain column, the second gate signal line 523 of that column is selected, and all of the second switching TFTs 526 connected to the selected second gate signal line 523 are turned ON. Thus, image signals can be written to that column only.

According to the aforementioned operations, writing of image signals to the pixels can be performed. As a result, switching between vertical and horizontal display can be achieved without using a frame memory, leading to reduction in size of a module.

Note that, switching of a control signal of each driver circuit can be performed by some operation of a user to switch between vertical and horizontal display, or the switching operation can be performed automatically depending on states of use (whether equipment is folded or opened, for example).

EMBODIMENT

Embodiment 1

A pixel configuration of the display device according to the invention is described with reference to FIG. 1.

Figure 1:
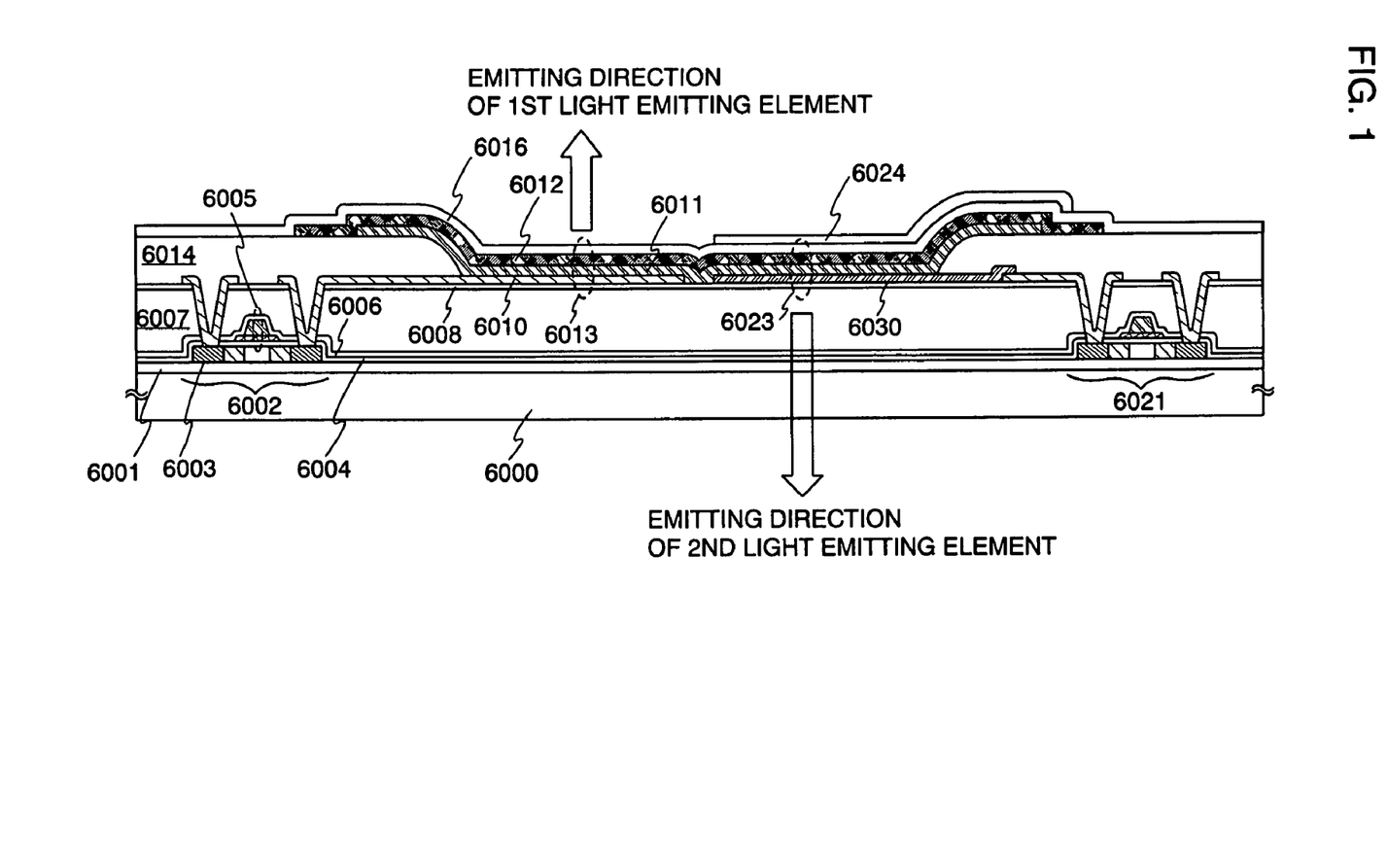
FIG. 1 is a cross sectional view of a light emitting portion of the display device according to the invention.

In FIG. 1, a base film 6001 is formed on a substrate 6000, and a first driving TFT 6002 and a second driving TFT 6021 are formed on the base film 6001.

The first driving TFT 6002 comprises an active layer 6003, a gate electrode 6005, and a gate insulating film 6004 which is sandwiched between the active layer 6003 and the gate electrode 6005. It is to be noted that although the gate electrode 6005 is formed of two layers having the upper layer and the lower layer with different widths in FIG. 1, it is not limited to this and may be formed of a single layer or multiple layers.

In addition, the first driving TFT 6002 is covered with a first interlayer insulating film 6006, and a second interlayer insulating film 6007 and a third interlayer insulating film 6008 are formed in this order over the first interlayer insulating film 6006.

Note that the first driving TFT 6002 and the second driving TFT 6021 have the same structure.

In FIG. 1, reference numerals 6010 and 6030 denote anodes of a first and a second light emitting elements respectively, 6011 denotes an electroluminescent layer, and 6012 denotes a cathode. An overlapping area of the anode 6010, the electroluminescent layer 6011 and the cathode 6012 corresponds to a first light emitting element 6013, and an overlapping area of the anode 6030, the electroluminescent layer 6011 and the cathode 6012 corresponds to a second light emitting element 6023. The first driving TFT 6002 controls a current supplied to the first light emitting element 6013, and it is electrically connected to the first light emitting element 6013 directly or through other elements. On the other hand, the second driving TFT 6021 controls a current supplied to the second light emitting element 6023, and it is electrically connected to the second light emitting element 6023 directly or through other elements.

Note that it is preferable to form the anode 6010 by using a highly reflective or light shielding material which has a high work function (preferably, more than 4.2 eV). Specifically, the anode 6010 is formed of a material such as gold (Au), platinum (Pt), nickel (Ni), tungsten (W), chrome (Cr), molybdenum (Mo), iron (Fe), cobalt (Co), copper (Cu), palladium (Pd), and titanium nitride (TiN). Alternatively, a conductive film having a high work function may be formed on a reflective (or light shielding) film in order to obtain the anode 6010. For example, a metal film such as Al is formed and indium tin oxide (ITO) or the like is laminated on the metal film. It is to be noted that the ITO formed on the Al film is only required to have a thickness enough to function as an anode of an EL, and is preferably thin so as to prevent deviation of light emitted from an EL layer due to the interference. On the other hand, the anode 6030 is preferably formed by using a material which has a high light transmittance. For example, ITO, zinc oxide (ZnO), indium zinc oxide (IZO), zinc oxide added with gallium, or the like may be employed. The cathode 6012 is preferably formed so as to have a low work function (preferably, 4.2 eV or less) and a high light transmittance. For example, a metal film such as Mg:Ag alloy is formed to be thin enough to transmit light (preferably, 10 nm or less) and ITO or the like is laminated on the metal film. As the thickness of a metal thin film is reduced, the resistance of the metal thin film is increased. However, ITO is not necessarily provided as long as the conductivity is high enough. Alternatively, a conductive material with a high light transmittance such as ITO may be used as the cathode 6012 regardless of a work function. In this case, in order to inject electrons more efficiently, a metal having a low work function such as alkali metal or alkaline earth metal, or an alloy including these metal elements is preferably added in the vicinity of an area in which the electroluminescent layer 6011 is in contact with the cathode 6012.

The electroluminescent layer 6011 is formed of a single light emitting layer or a plurality of layers including a light emitting layer.

The anode 6010 and the anode 6030 are formed on the third interlayer insulating film 6008. A resin film 6014 used as a bank is also formed on the third interlayer insulating film 6008.

A protective film 6016 is formed over the resin film 6014 and the cathode 6012. On the protective film 6016, a reflective film 6024 is formed and has a function to reflect light emitted from the second light emitting element 6023 and transmit the light in the direction of the substrate side only.

Light emitted from the first light emitting element 6013 is reflected on the anode 6010, and transmitted in the upper direction of the substrate only.

As described in this embodiment, by using a self-light emitting element as a display device, a thin display device having a thickness of 2 mm or less (preferably, 1 mm or less) and capable of displaying on both screens can be achieved, which was impossible with the conventional display device requiring a backlight.

Embodiment 2

Figure 7:
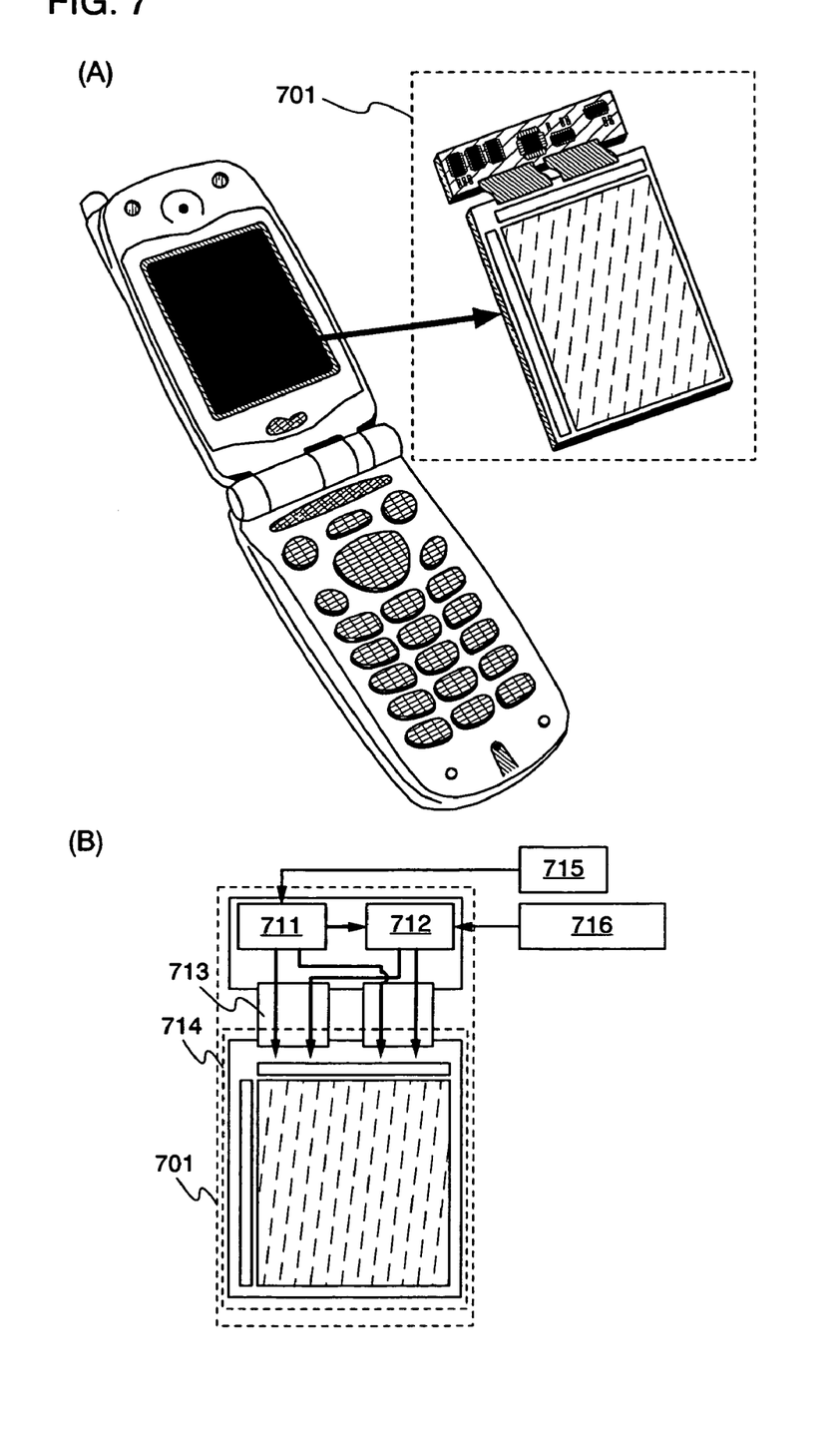
FIGS. 7(A) and 7(B) are block diagrams of a module and a display device which are mounted in portable information equipment.

When utilizing a display device for a display portion of electronic equipment such as a mobile phone, the display device is mounted in the equipment as a module 701 as shown in FIG. 7A. The module 701 includes here a display device and a substrate connected thereto, which mounts a signal processing LSI for driving the display device, a memory or the like.

FIG. 7B is a block diagram of the module 701. The module 701 comprises a power source portion 711, a signal control portion 712, an FPC 713, a display device 714. The power source portion 711 generates power source with desired voltage values from power source supplied from an external battery, and supplies it to a source signal line driver circuit, a gate signal line driver circuit, a light emitting element or the like. An image signal and a synchronous signal are inputted to the signal control portion 712. The signal control portion 712 converts various signals so as to be processed in the display device 714, and generates a clock signal or the like for driving the source signal line driver circuit and the gate signal line driver circuit.

Note that the power source portion 711 and the signal control portion 712 are formed separately from the display device 714 in the module 701 shown in this embodiment, they may be integrally formed on a substrate.

Embodiment 3

Figure 8:
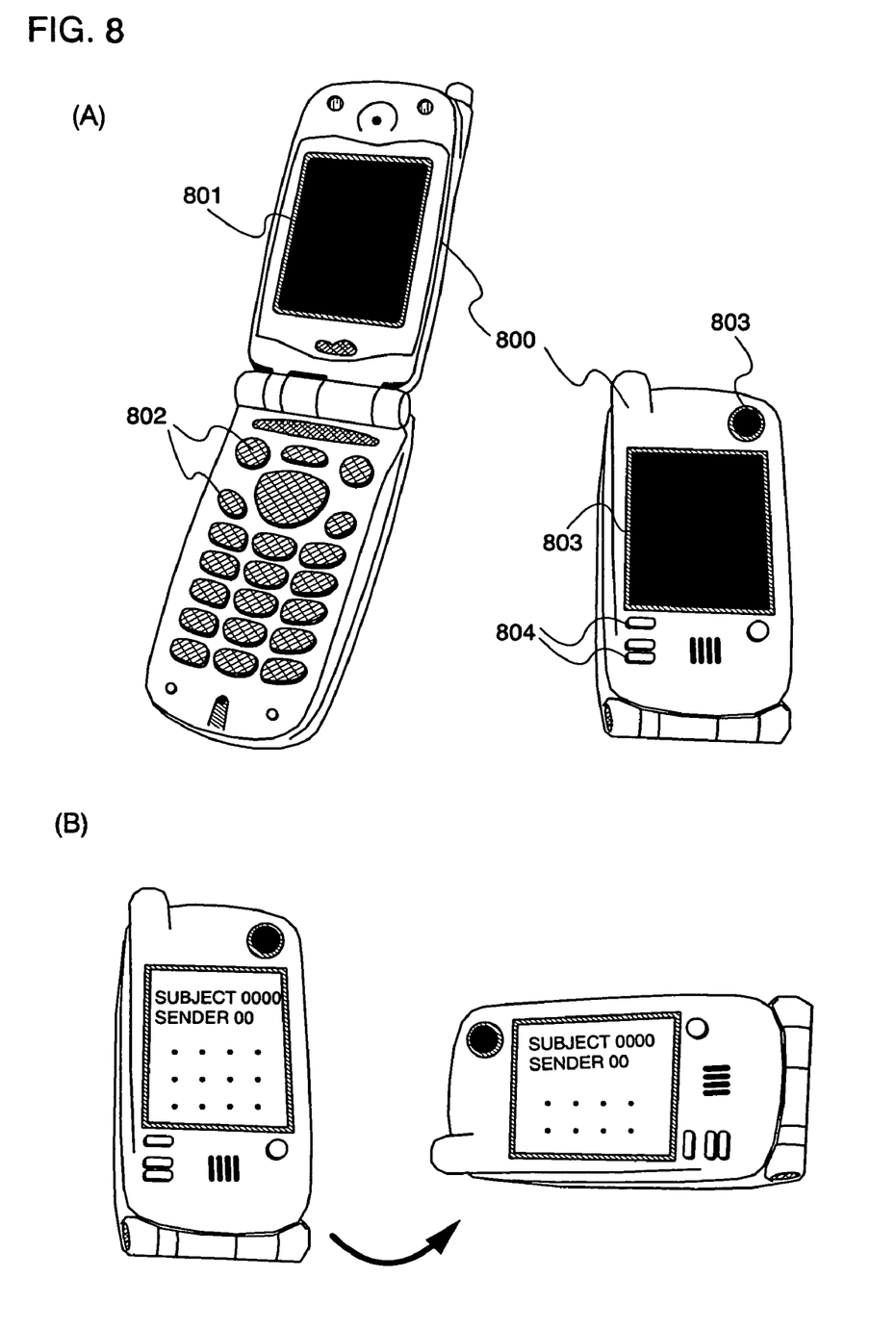
FIGS. 8(A) and 8(B) are views showing examples of application of the display device according to the invention.

FIGS. 8A and 8B show examples in which the display device of the invention is applied to a mobile phone which is one of the representative portable information equipment. Since the display device can display on each side of a substrate, a housing 800 can be reduced in thickness even when forming display portions on both screens as shown in FIG. 8A.

As an example of use, when the equipment is opened, a first display screen 801 is used as a main display screen and the screen is operated by operating buttons 802. The size of a second display screen 802 which is used when the equipment is folded has been limited because of the limited space. However, according to the invention, the second display screen 803 having the same display size as the first display screen 801 can be mounted so as to be used for checking e-mail, Web pages, or the like. When the equipment is folded, the operation is performed by operating buttons 804.

Recently, a mobile phone and the like provided with a digital camera has been widely used. In taking a picture facing a lens 805, the picture can be taken while monitoring on the second display screen 803 which has a large display region.

As shown in FIG. 8B, a user can switch between vertical and horizontal display at will. As described in Embodiment Mode 2, the switching between vertical and horizontal display can be performed automatically depending on the application or arbitrarily in accordance with the operation by a user.

It is needless to say that the mobile phone is shown as a representative example here, though the invention is not limited to this and can be easily applied to various equipment such as a PDA, a sub-note PC, and an electronic dictionary.

Embodiment 4

Figure 9:
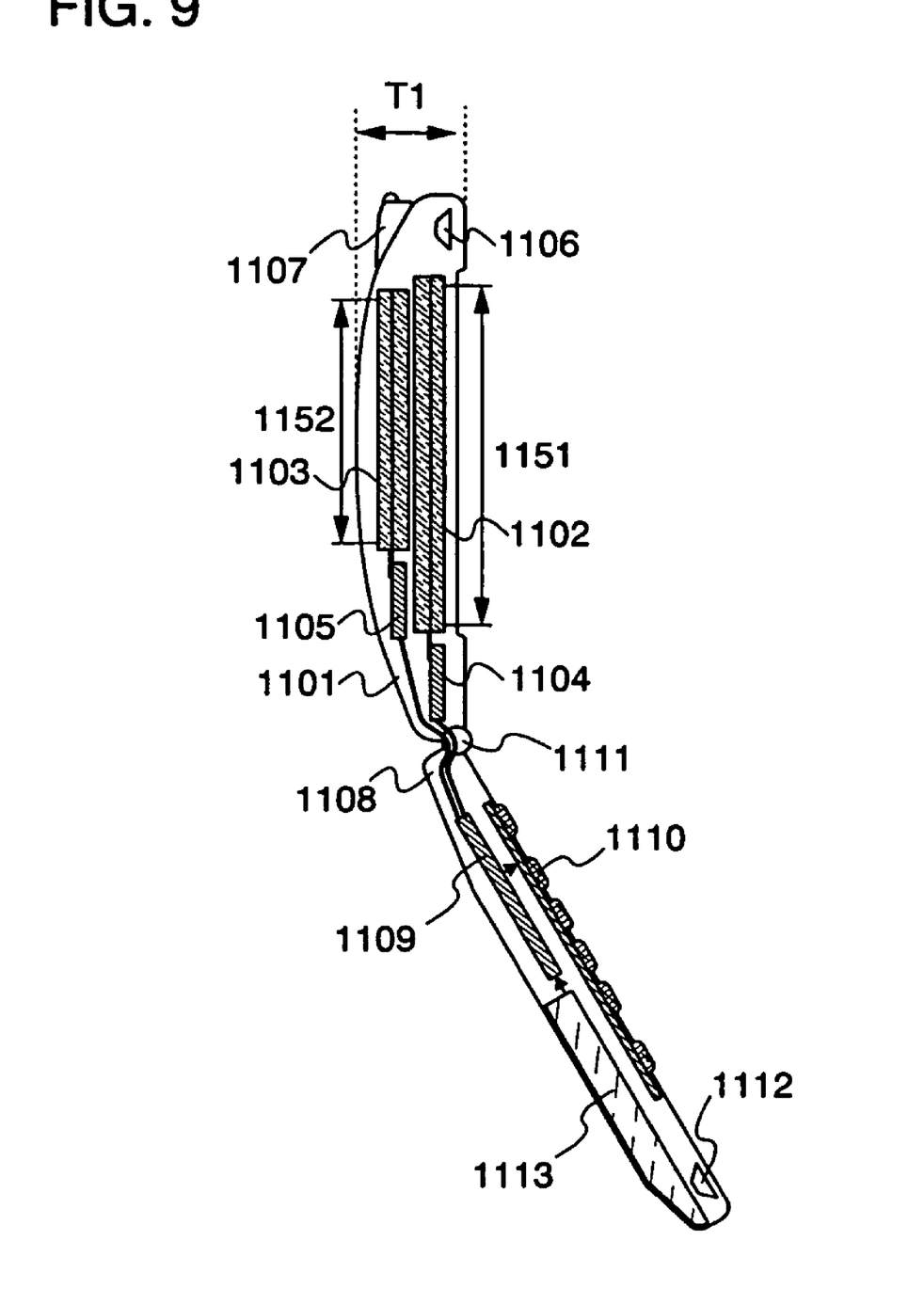
FIG. 9 is a cross sectional view of a mobile phone using a liquid crystal.
Figure 10:
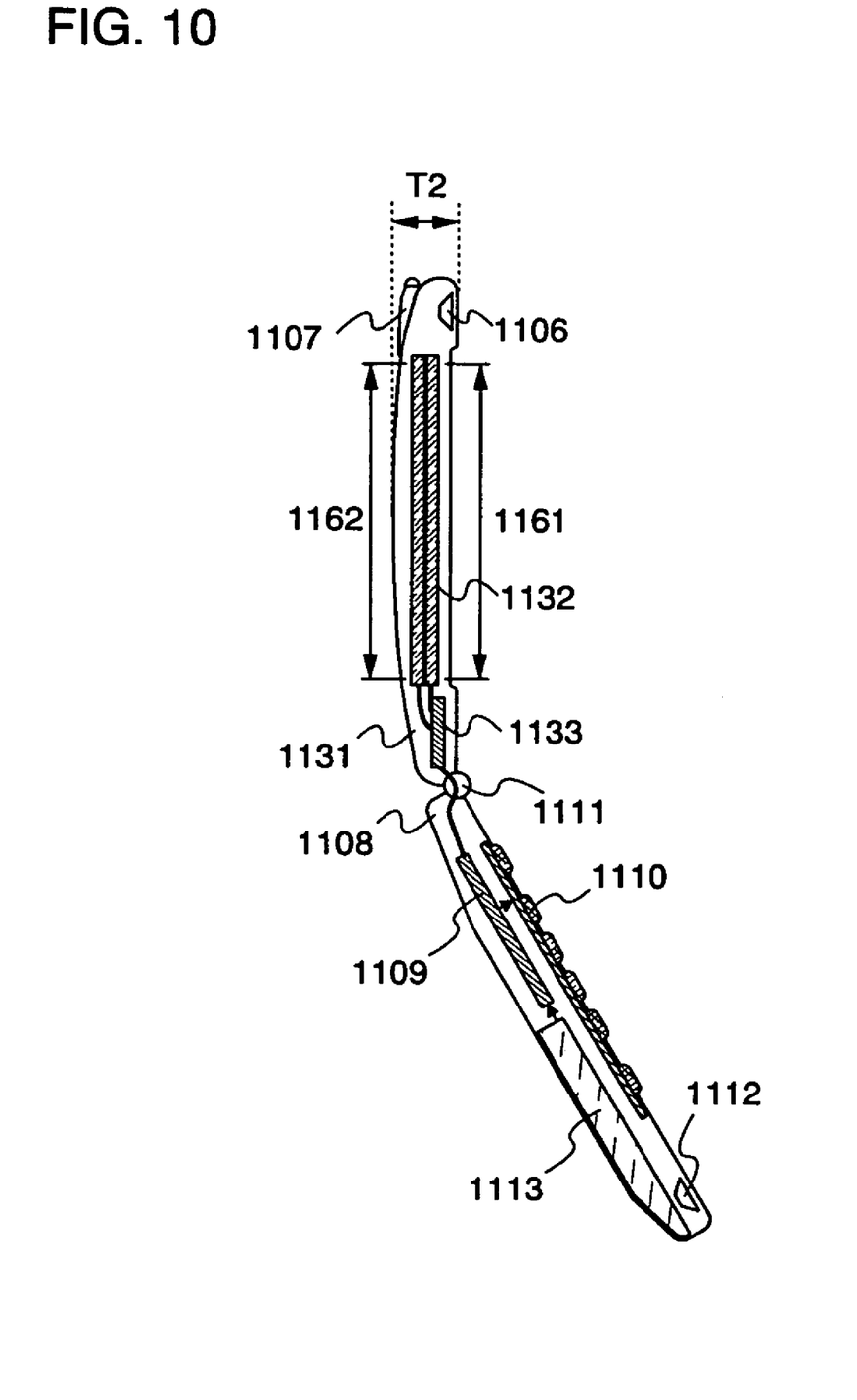
FIG. 10 is a cross sectional view of a mobile phone using the display device according to the invention.

FIG. 9 shows an example of a mobile phone which can display on both screens by using a conventional liquid crystal display device. FIG. 10 shows an example of a mobile phone which can display on both screens by using the display device of the invention. Note that the same portions are denoted by the same reference numerals in order to clearly show differences between the two examples.

A mobile phone shown in FIG. 9 comprises a first housing 1101 and a second housing 1108, and can be folded. The first housing 1101 includes a first display device (for main display) 1102 and a second display device (for sub-display) 1103, which are controlled by display controllers 1104 and 1105 respectively. The first housing 1101 further comprises a speaker 1106 and an antenna 1107.

The second housing 1108 comprises a main body driving module 1109, an operating button module 1110, a microphone 1112, and a battery 1113. The first housing 1101 and the second housing 1108 are connected to each other with a hinge 1111.

At this time, each of the first display device 1103 and the second display device 1102 includes a backlight. Reference numeral 1151 denotes a first display region and 1152 denotes a second display region. The thickness of a housing including the display devices, that is the first housing 1101 is denoted by T1.

A mobile phone shown in FIG. 10 also comprises a first housing 1131 and the second housing 1108. The structure of the second housing 1108 is the same as the conventional example shown in FIG. 9, therefore, the explanation is omitted here. In a display device 1132 of the invention, a self-light emitting element which is capable of emitting light in both directions is sandwiched between two substrates, and the display device 1132 is controlled by a single display controller 1133. Reference numeral 1161 denotes a first display region and 1162 denotes a second display region. The thickness of a housing including the display device, that is the first housing 1131 is denoted by T2.

When comparing the thickness of the first housings in the two examples, the first housing using the display device of the invention can be made much thinner. In the conventional example, the main display screen and the sub-display screen are provided by using two display devices each including a backlight, and thus T1 is increased in the case of displaying on both screens. On the other hand, since the display device of the invention adopts a self-light emitting element, it can display on both screens without backlight and can be drastically reduced in thickness as compared to the conventional example.

Further, when comparing the size of the second display regions in the two examples, the second display region using the display device of the invention is more suitable for a large screen.

As set forth above, the display device of the invention can significantly contribute to reduction in size and multifunction of a portable information terminal such as a mobile phone.

INDUSTRIAL APPLICABILITY

A sub-display screen of conventional portable information equipment is limited to a small size because of the space and the cost. However, according to the invention, a large screen can be mounted in the portable information equipment as a sub-display screen. Further, a function of switching between vertical and horizontal display can be easily mounted, leading to higher added value of the portable information equipment.

In addition, by utilizing a self-light emitting element which does not require a backlight, a quite thin and lightweight display device can be fabricated.

The invention claimed is:

1. A display device comprising:
   a pixel portion in which a plurality of pixels are arranged in a matrix over a substrate, wherein at least one of the pixels comprises a first light emitting element, a second light emitting element, a first transistor and a second transistor,
   wherein the first light emitting element comprises an electroluminescent layer between a first electrode and a second electrode,
   wherein the second light emitting element comprises the electroluminescent layer between the first electrode and a third electrode,
   wherein the first light emitting element emits light in a first direction,
   wherein the second light emitting element emits light in a second direction which is opposite to the first direction,
   wherein the first electrode covers the electroluminescent layer,
   wherein the first transistor is electrically connected to the first light emitting element, and
   wherein the second transistor is electrically connected to the second light emitting element.

2. The display device according to claim 1, wherein the display device comprises means for selecting whether the first light emitting element emits light or no light; and
   means for selecting whether the second light emitting element emits light or no light.

3. The display device according to claim 1, wherein a source signal line driver circuit, a first gate signal line driver circuit and a second gate signal line driver circuit are formed on the surface of the substrate on which the pixel portion is formed, and
   wherein a scan direction of the first gate signal line driver circuit is orthogonal to that of the second gate signal line driver circuit.

4. An electronic device using the display device according to claim 1.

5. A display device according to claim 1, wherein the first electrode, the second electrode and the third electrode have light transmitting properties.

6. A display device according to claim 1, further comprising a reflective film over the first electrode, wherein the reflective film overlaps with the third electrode.

7. A display device comprising:
a pixel portion in which a plurality of pixels are arranged in a matrix over a substrate,
wherein at least one of the pixels comprises a first light emitting element, a second light emitting element, a first transistor and a second transistor,
wherein the first light emitting element comprises an electroluminescent layer between a first electrode and a second electrode,
wherein the second light emitting element comprises the electroluminescent layer between the first electrode and a third electrode,
wherein the first light emitting element emits light in a first direction,
wherein the second light emitting element emits light in a second direction which is opposite to the first direction,
wherein the first electrode covers the electroluminescent layer,
wherein the first transistor is electrically connected to the first light emitting element, and
wherein the second transistor is electrically connected to the second light emitting element, and
means for selecting either or both of the two directions in which the first light emitting element and the second light emitting element emit light.

8. The display device according to claim 7, wherein a source signal line driver circuit, a first gate signal line driver circuit and a second gate signal line driver circuit are formed on the surface of the substrate on which the pixel portion is formed, and
wherein a scan direction of the first gate signal line driver circuit is orthogonal to that of the second gate signal line driver circuit.

9. An electronic device using the display device according to claim 7.

10. A display device according to claim 7, wherein the first electrode, the second electrode and the third electrode have light transmitting properties.

11. A display device according to claim 7, further comprising a reflective film over the first electrode, wherein the reflective film overlaps with the third electrode.

12. A display device comprising:
a pixel portion in which a plurality of pixels are arranged in a matrix over a substrate,
wherein at least one of the pixels comprises a first light emitting element and a second light emitting element,
wherein the first light emitting element comprises an electroluminescent layer between a first electrode and a second electrode,
wherein the second light emitting element comprises the electroluminescent layer between the first electrode and a third electrode,
wherein the first light emitting element emits light in a first direction,
wherein the second light emitting element emits light in a second direction which is opposite to the first direction,
wherein a source signal line driver circuit, a first gate signal line driver circuit and a second gate signal line driver circuit are formed on the surface of the substrate on which the pixel portion is formed,
wherein a scan direction of the first gate signal line driver circuit is orthogonal to that of the second gate signal line driver circuit, and
wherein the first electrode covers the electroluminescent layer.

13. The display device according to claim 12, wherein the display device comprises means for selecting whether the first light emitting element emits light or no light; and
means for selecting whether the second light emitting element emits light or no light.

14. An electronic device using the display device according to claim 12.

15. A display device according to claim 12, wherein the first electrode, the second electrode and the third electrode have light transmitting properties.

16. A display device according to claim 12, further comprising a reflective film over the first electrode, wherein the reflective film overlaps with the third electrode.

17. A display device comprising:
a pixel portion in which a plurality of pixels are arranged in a matrix over a substrate,
wherein at least one of the pixels comprises a first light emitting element and a second light emitting element,
wherein the first light emitting element comprises an electroluminescent layer between a first electrode and a second electrode,
wherein the second light emitting element comprises the electroluminescent layer between the first electrode and a third electrode,
wherein the first light emitting element emits light in a first direction,
wherein the second light emitting element emits light in a second direction which is opposite to the first direction, and
means for selecting either or both of the two directions in which the first light emitting element and the second light emitting element emit light,
wherein a source signal line driver circuit, a first gate signal line driver circuit and a second gate signal line driver circuit are formed on the surface of the substrate on which the pixel portion is formed,
wherein a scan direction of the first gate signal line driver circuit is orthogonal to that of the second gate signal line driver circuit, and
wherein the first electrode covers the electroluminescent layer.

18. An electronic device using the display device according to claim 17.

19. A display device according to claim 17, wherein the first electrode, the second electrode and the third electrode have light transmitting properties.

20. A display device according to claim 17, further comprising a reflective film over the first electrode, wherein the reflective film overlaps with the third electrode.

21. A display device comprising:
a pixel portion in which a plurality of pixels are arranged in a matrix over a substrate, at least one of the pixels comprising:
a first light emitting element;
a second light emitting element;
a first transistor; and
a second transistor,
wherein the first light emitting element comprises an electroluminescent layer between a first electrode and a second electrode,
wherein the second light emitting element comprises the electroluminescent layer between the first electrode and a third electrode,
wherein the first electrode is opposite to the second electrode an the third electrode,
wherein the first light emitting element emits light through the first electrode, wherein the second light emitting element emits light through the third electrode, wherein the first electrode covers the electroluminescent layer, wherein the first transistor is electrically connected to the first light emitting element, and wherein the second transistor is electrically connected to the second light emitting element.

22. An electronic device using the display device according to claim 21.

23. A display device according to claim 21, wherein the first electrode, the second electrode and the third electrode have light transmitting properties.

24. A display device according to claim 21, further comprising a reflective film over the first electrode, wherein the reflective film overlaps with the third electrode.

25. A display device comprising:
a pixel portion in which a plurality of pixels are arranged in a matrix over a substrate, at least one of the pixels comprising:
a first light emitting element;
a second light emitting element;
a first transistor; and
a second transistor,
wherein the first light emitting element comprises an electroluminescent layer between a first electrode and a second electrode,
wherein the second light emitting element comprises the electroluminescent layer between the first electrode and a third electrode,
wherein the first light emitting element emits light in a first direction,
wherein the second light emitting element emits light in a second direction which is opposite to the first direction,
wherein the first electrode covers the electroluminescent layer,
wherein the first transistor is electrically connected to the first light emitting element,
wherein the second transistor is electrically connected to the second light emitting element, and
wherein a gate electrode of the first transistor is electrically connected to a gate electrode of the second transistor.

26. An electronic device using the display device according to claim 25.

27. A display device according to claim 25, wherein the first electrode, the second electrode and the third electrode have light transmitting properties.

28. A display device according to claim 25, further comprising a reflective film over the first electrode, wherein the reflective film overlaps with the third electrode.

29. A display device comprising:
a pixel portion in which a plurality of pixels are arranged in a matrix over a substrate, at least one of the pixels comprising:
a first light emitting element;
a second light emitting element;
a first transistor;
a second transistor;
a first switch for supplying a current to the first light emitting element; and
a second switch for supplying a current to the second light emitting element,
wherein the first light emitting element comprises an electroluminescent layer between a first electrode and a second electrode,
wherein the second light emitting element comprises the electroluminescent layer between the first electrode and a third electrode,
wherein the first light emitting element emits light in a first direction,
wherein the second light emitting element emits light in a second direction which is opposite to the first direction, and
wherein the first electrode covers the electroluminescent layer,
wherein the first transistor is electrically connected to the first light emitting element, and
wherein the second transistor is electrically connected to the second light emitting element.

30. An electronic device using the display device according to claim 29.

31. A display device according to claim 29, wherein the first electrode, the second electrode and the third electrode have light transmitting properties.

32. A display device according to claim 29, further comprising a reflective film over the first electrode, wherein the reflective film overlaps with the third electrode.

* * * * *